(12) United States Patent
Hladschik

(10) Patent No.: US 6,493,645 B1
(45) Date of Patent: Dec. 10, 2002

(54) METHOD FOR DETECTING AND CLASSIFYING SCRATCHES OCCURRING DURING WAFER SEMICONDUCTOR PROCESSING

(75) Inventor: Thomas Hladschik, Glen Allen, VA (US)

(73) Assignee: Infineon Technologies North America Corp, San Jose, CA (US)

( * ) Notice: Subject to any disclaimer, the term of this patent is extended or adjusted under 35 U.S.C. 154(b) by 0 days.

(21) Appl. No.: 09/481,770

(22) Filed: Jan. 11, 2000

(51) Int. Cl.[7] .............................................. G06F 19/00

(52) U.S. Cl. ............................ 702/81; 702/82; 702/83; 702/84; 702/34; 702/182; 702/183

(58) Field of Search ............................... 702/81, 82, 84, 702/94, 182; 700/110; 257/48; 356/615; 382/145; 219/411

(56) References Cited

U.S. PATENT DOCUMENTS

| | | | |
|---|---|---|---|
| 5,950,181 A | 9/1999 | Federl | 706/15 |
| 6,202,037 B1 * | 3/2001 | Hattori et al. | 700/109 |
| 6,240,329 B1 * | 5/2001 | Sun | 257/48 |

* cited by examiner

Primary Examiner—Kamini Shah (57) ABSTRACT

This method for detecting and classifying a scratch on a semiconductor wafer, in accordance with the invention, first defines a coordinate system on the wafer. The method creates a list of failed cells according to coordinates corresponding to the cell failures on the wafer. The number of failed cells, in total, is determined. Through calculating the standard deviation of the failed cells at a plurality of different angles, based on the list of failed cells and the total number of failed cells, a determination is made as to whether the wafer has a potential scratch. Plotting the standard deviations versus the number of failed cells and comparing that point to other known points determines the presence of a scratch. The steps of detecting and classifying scratches occurring on wafers may be performed by a computer.

13 Claims, 9 Drawing Sheets

METHOD FOR DETECTING AND CLASSIFYING SCRATCHES OCCURRING DURING WAFER SEMICONDUCTOR PROCESSING

BACKGROUND

1. Technical Field

This disclosure relates to semiconductor wafers and more particularly, to a method of detecting and classifying scratches occurring during wafer processing and can also be applied to any image detection or recognition problem dealing with elongated patterns.

2. Description of the Related Art

Semiconductor wafers, such as those made of silicon, are used as a substrate for processing integrated circuits chips. Scratches routinely result from the manufacture process, for example, as the result of contact printing, a lithography process, where a mask comes in contact with the wafer for purposes of building circuits. To classify the wafers in the past, manual inspection by an engineer was necessary. Manual inspection is so time consuming that inspection of each wafer is economically impossible.

During wafer processing, defect inspection techniques and electrical tests identify certain fail signatures that indicate the presence of a scratch. The results of these inspection techniques can include, for example, detailed wafer maps or bit fail maps. In a manufacturing environment that processes thousands of wafers per week it is not practical to manually classify every wafer for reasons of time and efficiency.

Therefore a need exists for an efficient method of detecting and classifying scratches occurring during wafer processing in the semiconductor industry.

SUMMARY OF THE INVENTION

The method for detecting and classifying a scratch on a semiconductor wafer, in accordance with the invention, first defines a coordinate system on the wafer. The method creates a list of failed cells according to coordinates corresponding to the cell failures on the wafer. The number of failed cells, in total, is determined. Through calculating the standard deviation of the failed cells at a plurality of different angles, based on the list of failed cells and the total number of failed cells, a determination is made as to whether the wafer has a potential scratch. Plotting the standard deviations versus the number of failed cells and comparing that point to other known points determines the presence of a scratch. The steps of detecting and classifying scratches occurring on wafers may be performed by a computer.

In other methods, the step of defining a coordinate system on the wafer may include the steps of assigning chips on the wafer a number of cells in the x and y directions and defining the coordinate system based on the cells and a number of chips. The step of creating a list of failed cells, may include the steps of assigning failed cells a value, creating the list of failed cells based on the cells assigned the value, and creating the list of failed cells according to locations on the coordinate system. The step of determining a standard deviation of the failed cells at a plurality of different angles, may include the steps of calculating the standard deviation for the plurality of different angles from a given position, determining the ratio of a lowest standard deviation to a highest standard deviation of the calculated standard deviations, graphing the ratio of standard deviations versus the total number of failed cells, and comparing a graphed point to points stored in a database to determine if a scratch exists. The step of determining a standard deviation of the failed cells at a plurality of different angles, may include the steps of calculating the ratio of a lowest standard deviation to a highest standard deviation from a plot of standard deviations, and comparing the ratio of standard deviations and number of failed cells against a range of values to determine if a scratch exists on the wafer. The step of comparing a ratio of standard deviations to the number of failed cells to determine the presence of a scratch, may include plotting the ratio of a lowest standard deviation to a highest standard deviation versus the number of failed cells, determining a position in the plot for the ratio and the number of failed cells, and comparing the position to other known positions from prior tests of wafers to determine if a scratch exists.

The step of calculating the standard deviation for the plurality of different angles from a given position, may include the steps of rotating the list of failed cells by a user defined angle, transforming the list of failed cells through coordinate transformation, calculating the standard deviation at each angle relative to the given position, and creating a schedule of standard deviations at the different angles.

A method for detecting and classifying scratches occurring during semiconductor wafer processing may include the steps of defining a total number of cells of a predefined size in an x and y direction, for chips on a wafer, calculating a total number of cells on the wafer, and developing a normalized coordinate system that assigns values between zero and one for each x and y coordinate, assigning failed cells a value, creating a schedule of a location of failed cells in the coordinate system, defining a number of failed cells, having the assigned value from the schedule of failed cells, calculating a standard deviation at different angles to a given line by rotating the positions of the failed cells by a user defined angle, transforming a coordinate list through coordinate transformation, creating a schedule of standard deviations at the different angles, determining a lowest standard deviation and a highest standard deviation from the schedule, calculating a ratio of the lowest standard deviation to the highest standard deviation for the wafer from the schedule, and determining the presence of a scratch by comparing the ratio and the number of failed cells against a range of values which are likely to denote a scratch on the wafer.

In other methods, the step of developing a normalized coordinate system that assigns values between zero and one for each x and y coordinate, may include the step of developing a system of cells that assigns values between zero and one for each x and y coordinate by dividing the value in the x or y direction by the total number of cells in the same x or y plane of the cell. The step of assigning failed cells a value, creating a schedule of the location of failed cells in the coordinate system, may include the step of assigning the failed cells the value of 1. The step of calculating a standard deviation several times, at different angles to a fixed position by rotating the coordinate list of failed cells by a user defined angle, may include the steps of rotating through coordinate transformation and determining the standard deviation at the new angle from the given line. The step of creating a schedule of standard deviations at the different angles may include the steps of plotting the standard deviation versus the angle of transformation and identifying the lowest standard deviation and the highest standard deviation from a graph of standard deviation versus the angle of transformation. The step of determining the presence of a scratch by comparing the ratio and the number of failed cells against a range of values which are likely to denote a scratch may include the step of plotting the ratio versus number of failed cells and comparing the plot to a database of stored points corresponding to scratches on a set of pervious wafers.

A method detecting and classifying an elongated pattern on an image may include defining a coordinate system for a digitally rendered image creating a list of positions on a pixel map relating to an object on the coordinate system, defining a total number of pixels relating to the object, determining a standard deviation of the pixels relating to the object at a plurality of different angles based on the list of pixel positions and the total number of pixels relating to the object, and comparing a ratio of standard deviations to the number of pixels relating to the object to determine the presence of the elongated pattern.

In other methods the step of determining a standard deviation of the failed cells at a plurality of different angles, may include the steps of calculating the standard deviation for the plurality of different angles from a given position, determining the ratio of a lowest standard deviation to a highest standard deviation of the calculated standard deviations, graphing the ratio of standard deviations versus the total number of pixels relating to the object, and comparing a graphed point to points stored in a database to determine if the elongated pattern exists. The means for determining a standard deviation at a plurality of different angles based on the list of pixel positions and the total number of pixels relating to the object, may include the steps of rotating the list of pixels by a user defined angle, transforming the list of pixels through coordinate transformation, calculating the standard deviation at each angle relative to the given position, and creating a schedule of standard deviations at the different angles. The means for determining a standard deviation at a plurality of different angles based on the list of pixels positions and the total number of pixels relating to the object, may include the steps of calculating the ratio of a lowest standard deviation to a highest standard deviation from a plot of standard deviations, and comparing the ratio of standard deviations and number of pixels relating to the object, against a range of values to determine if the elongated pattern exists on the wafer. The method may include the steps of comparing the ratio of standard deviations to the number of pixels relating to the object to determine the presence of the pattern, may include, plotting the ratio of a lowest standard deviation to a highest standard deviation versus the number of pixels relating to the object, determining a position in the plot for the ratio and the number of pixels relating to the object, and comparing the position to other known positions from prior tests of images to determine if the elongated pattern exists.

BRIEF DESCRIPTION OF THE DRAWINGS

This disclosure will present in detail the following description of preferred embodiments with reference to the following figures wherein.

DETAILED DESCRIPTION OF PREFERRED EMBODIMENTS

Through the use of the present invention, classification of scratches on semiconductor wafers can be achieved efficiently. The results may allow the processors to correlate scratch type defects to the appropriate tools and recipes that can be used to increase yield and therefore chip output. The invention applies equally to an image, and attempted classification of a pattern on the image.

The present disclosure describes a method for detecting and classifying scratches occurring during wafer processing in the semiconductor industry. The invention is a new, efficient method of classifying a group of failed cells as either a scratch or non-scratch arrangement on a semiconductor wafer. Fast and accurate classification is needed to implement corrective measures in the chip manufacture process as to prevent further defects of the type detected. Performing the classification by traditional, time consuming, manual inspection is inefficient considering the number of wafers produced. The present invention may be implemented in hardware or software that performs the classification of scratches. A database of previous scratches and corrective procedures may be used to determine which corrective procedures will have the best results in current situations.

Figure 1:
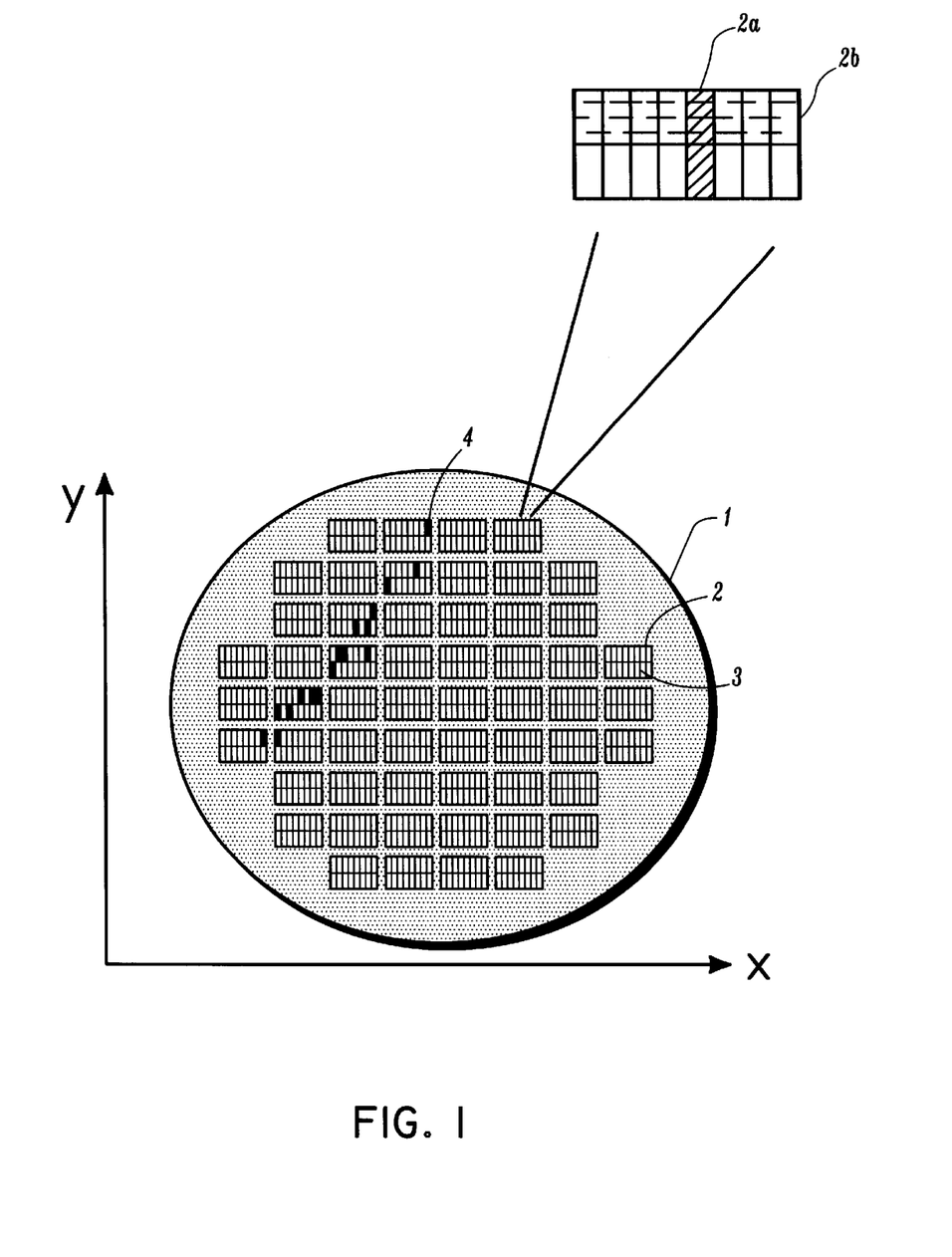
FIG. 1 is an illustration of a wafer map showing a quasi linear scratch pattern affecting multiple chips on the wafer, and an individual chip showing a typical configuration of cells in accordance with the present invention.
Figure 2A:
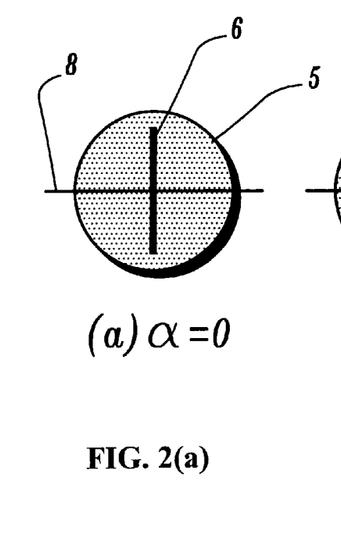
FIGS. 2(a)–2(b) are an illustration of a rotated black and white image of a scratch at defined angles and a fixed line in accordance with the present invention.
Figure 2B:
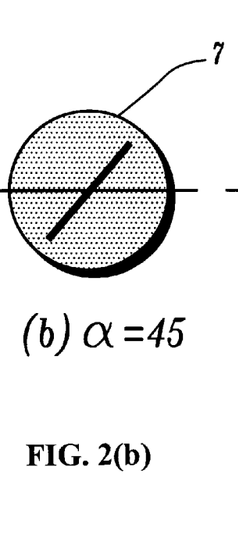
Figure 2C:
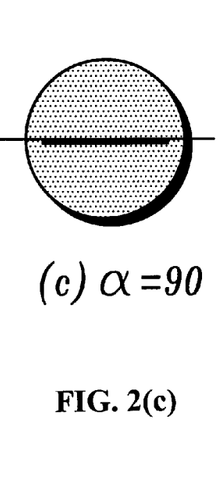
Figure 2D:
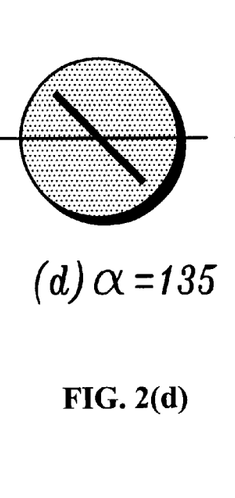
Figure 2E:
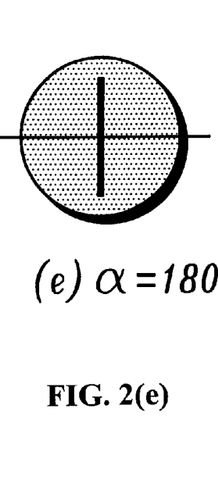

The present invention defines two parameters per wafer, which indicate whether the wafer includes a linear scratch, or not. The method identifies linear scratches which are ideally straight, oriented in any direction, on any location of the wafer, for example, FIG. 1 shows a wafer 1 and an example of a scratch on a wafer beginning at a failed cell 4. Other types of scratches are contemplated. Tests by the inventors have shown that the method is able to detect curved scratches. The example depicts a capture of sixteen cells per chip 2, arranged in a two by eight pattern, however this may vary depending on computing power and the precision of the test data, including for example, electrical tests, and in situ tests.

Figure 5:
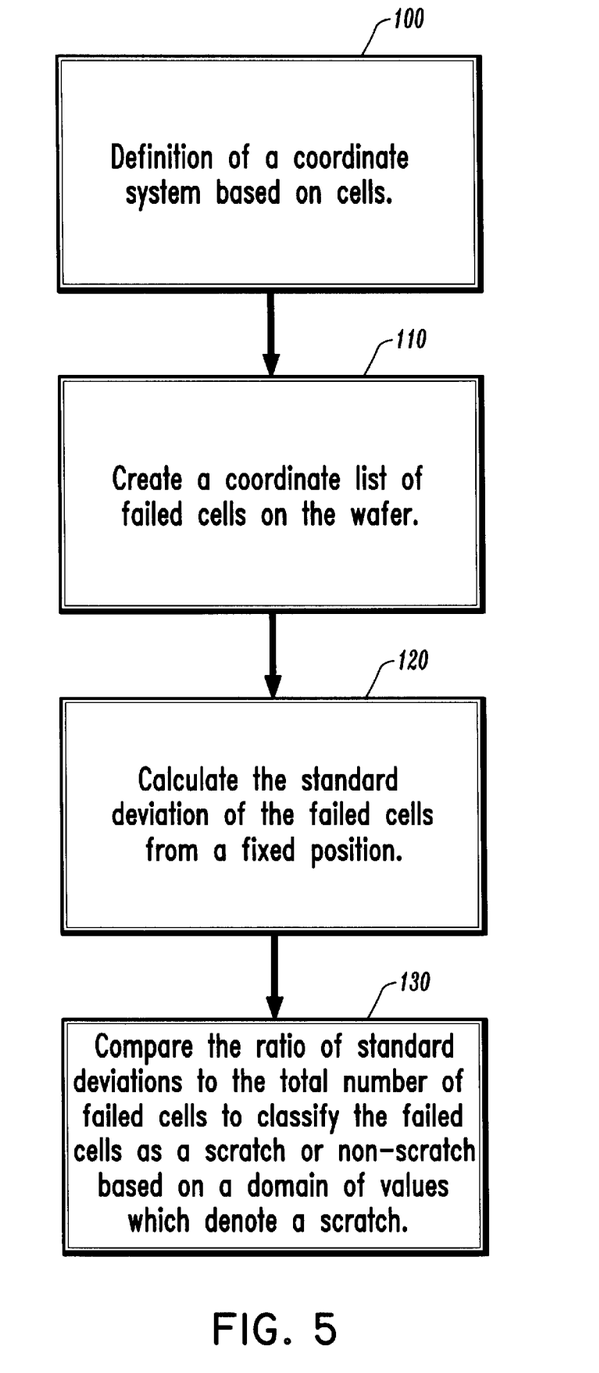
FIG. 5 is a flow chart for making a determination of the presence of a scratch on a semiconductor device in accordance with the present invention.

FIG. 5 shows a flow chart of the steps involved in the method. Before the method is able to test for the defined parameters, it is necessary to identify and classify each cell 3. A function performed in accordance with the method identifies individual cells on a wafer 1. The function defines a new coordinate system in block 100 of FIG. 5, based on a cell (¹⁄₁₆ of the chip in the example).

Each wafer has Nx$_{max}$ chips in x-direction and Ny$_{max}$ in y-direction. New coordinates (x, y) for each cell on each chip are assigned according to the position of each chip 2 on the wafer 1 and each cell 3 on the individual chips 2. The chip 2 is split into columns 2a and rows 2b; each chip 2 has y rows and x columns. In this example, each chip 2 has two by eight cells, other sizes are contemplated. The rows 2b are assigned a number beginning with zero at the lower most cell on each chip 2 and increasing to the top row. The columns 2a are assigned a number, for example, beginning with zero at the left most cell on each chip and increasing to the right most column. In the example, each cell 3 in a row is a discrete value, for example, either a zero or a one and each cell in a column is assigned a number, for example, from zero to seven.

The position of each cell 3 on each chip 2 is then multiplied by a function, as will be described, to yield a value corresponding to each cell's location on the wafer 1. In the case of the positions relevant to the x-axis, the cell value within each chip is added to the product of the chip number and the number of cells in the x-axis of each chip. The chip number being a value assigned to each chip in the same manner as each cell was assigned a value above within each chip, except that the rows and columns are now comprised of whole chips, and the chip number relates to the position of the chip on the wafer as a whole. In the example, a cell located at 4 would be assigned the x-coordinate thirty-one. (7+(3 H 8)=31). In the case of the location relevant to the y-axis, the cell value within each chip is added to product of the chip number and the number of cells in the y-axis of each chip. The y-coordinate of the cell described above is seventeen. (1+(8 H 2)=17). The coordinate position of the failed cell 4 being (31, 17). Other systems for discreetly identifying cells may also be employed.

The function described above may be written as:

Up_down=denoting the position of the cell in y-direction internal_x=denoting the position of the cell in x-direction chipx=position of the chip on the wafer, beginning with zero at the left column chipy=psion of the chip on the wafer, beginning with zero at the bottom row x=(internal_x+chipx×8)/(Nxmax×8)

y=(up_down+chipy×2)/(Nymax×2)

The value resulting from the above function is then normalized by dividing by the total number of cells in the given column or row of the wafer. The total number of cells is determined by multiplying the number of chips in any column or row by the number of cells defined in each chip. Normalization ensures that the value of x and y for each coordinate is between zero and one and takes into account that the data used for the analysis might have a finer resolution in one direction then the other. For the cell 4 with the coordinates (31, 17), and the total wafer being sixty-four by eighteen cells (64H18), the final coordinates are, 31/64= 0.484375 and 17/18=0.94444. The new coordinate being defined by the algorithm as (0.484375, 0.94444).

Figure 6:
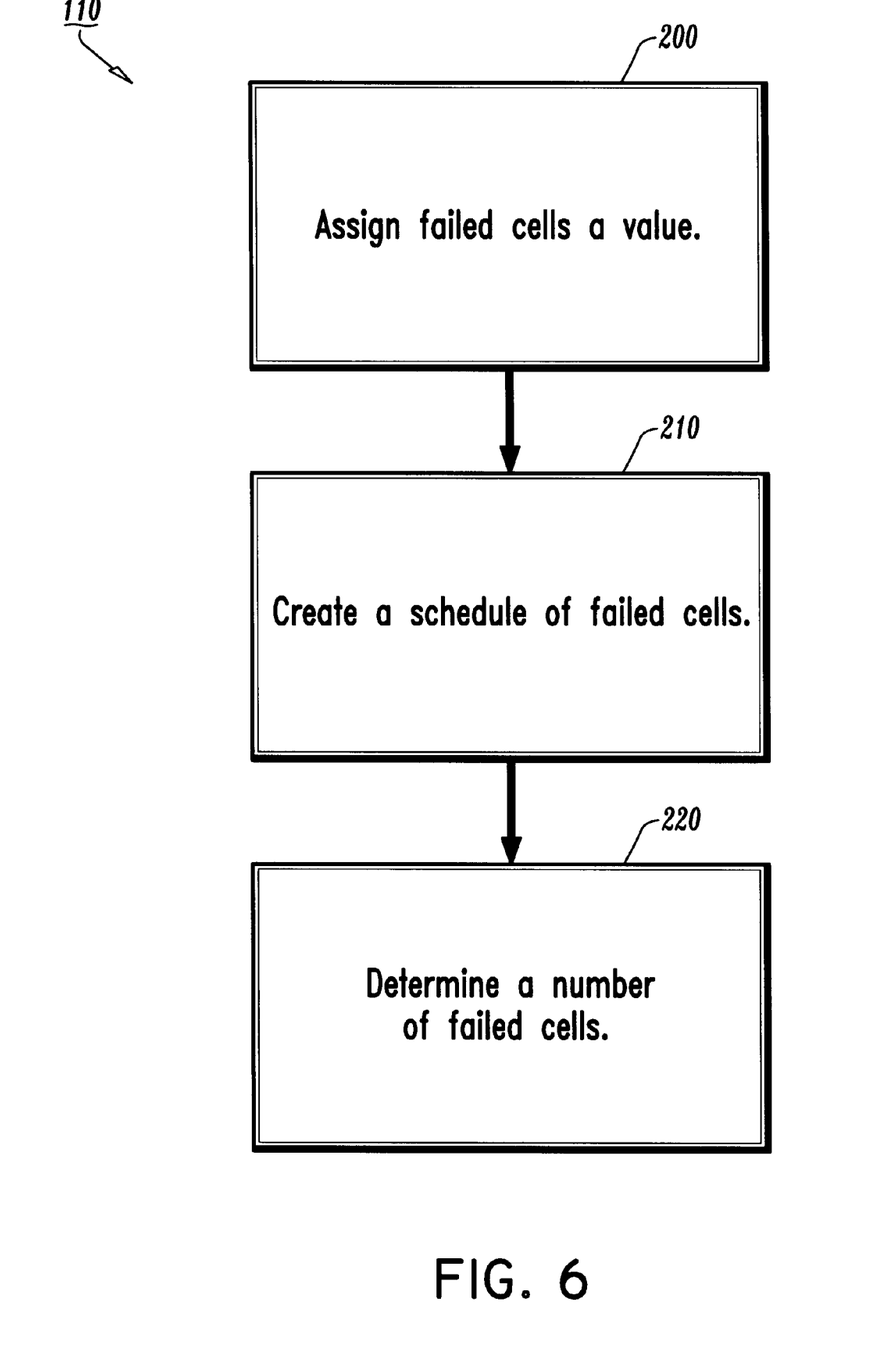
FIG. 6 is a flow chart of block 110 FIG. 5, showing the number of failed cells in accordance with the present invention.

According to block 110 of FIG. 5, a coordinate list or schedule of failed cells is then created. Any cell determined to be affected by the scratch, e.g. a failed cell 4, is assigned a value as shown in block 200 of FIG. 6. The preferred value is one, but other values are contemplated. Failed cells are also assigned a distinguishing feature when an image of the wafer 1 is produced, the feature may be the color black, though other distinguishing features are contemplated, for example, gray scale or patterns. The method then creates a coordinate schedule of failed cells, according to block 210, and calculates N, as in block 220. N, the number of failed cells is equal to the number of cells with the value one. In FIG. 1, N equals sixteen, as there are sixteen failed cells in this example.

A function calculates a standard deviation [$\sigma^2$] in block 120 of FIG. 5 of the x coordinate of the group of failed cells on the wafer from a line in x-direction 8. The standard deviation may be calculated by:

$$\sigma^2 = \frac{\sum_{i=1}^{N}(x_i - \bar{x})^2}{N^2}, \quad \text{with} \quad \bar{x} = \frac{1}{N}\sum_{i=1}^{N} x_i$$

This standard deviation will relate to the angle of the image of the wafer, for example, zero degrees for the first iteration. This example uses the standard deviation squared, though this is not the only standard deviation contemplated by the invention. Likewise the standard deviation, as used to determine a relative position is one method, others are contemplated, such as absolute distance from a fixed point and standard deviation of y coordinates from a line in y-direction.

Figure 7:
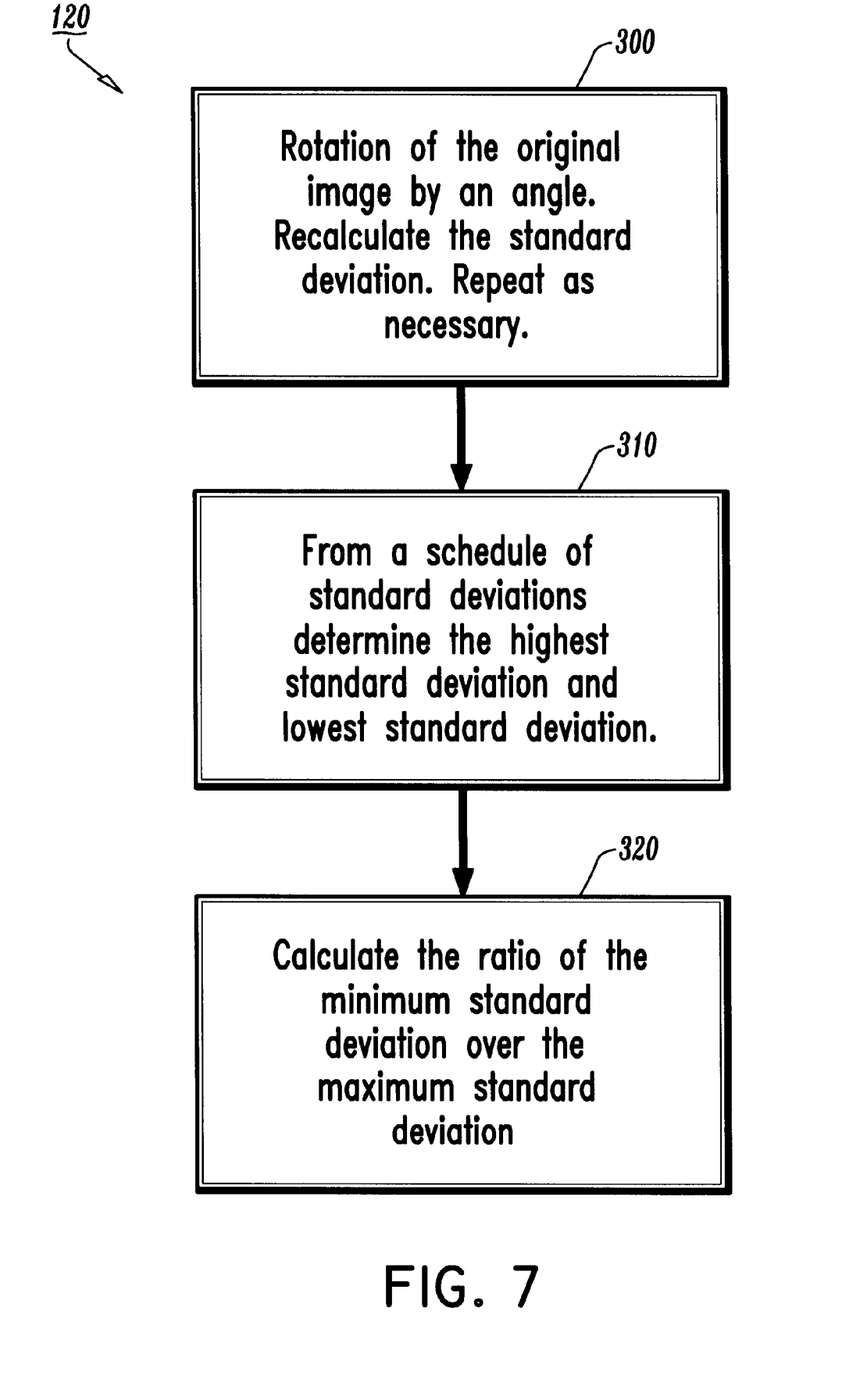
FIG. 7 is a flow chart of block 120 FIG. 5, showing the calculation of the ratio of lowest standard deviation to the highest standard deviation from a list of standard deviations, in accordance with the present invention.

Referring to FIG. 2, the method then rotates the image 5 by an angle ($\alpha$), and results in the new image 7 of the same potential scratch. The angle may be entered by a user or preset. The rotation is achieved through a coordinate transformation in block 300 of FIG. 7. The position of x$_{new}$ will equal the value of x times the cosine of $\alpha$ plus the value of y times the sine of $\alpha$. The position of y$_{new}$ will equal the value of x times the negative sine of $\alpha$ plus y times the cosine of $\alpha$. This is one example of a transformation, other transformations are also contemplated such as a transformation by randomized angles or transformations in the counterclockwise direction. The formula for the transformation can be written as:

$$\begin{pmatrix} x\text{new} \\ y\text{new} \end{pmatrix} = \begin{pmatrix} \cos\Phi \sin\Phi \\ -\sin\Phi \cos\Phi \end{pmatrix} \begin{pmatrix} x \\ y \end{pmatrix}$$

where:

xnew=x cos$\Phi$+y sin$\Phi$ ynew=-x sin$\Phi$y cos$\Phi$

Once each cell has been transformed the standard deviation is then recalculated, using the same formula as the first iteration, for the new image 7 against the original fixed position, preferably a line in x-direction 8 for a linear scratch. The line in x-direction 8 is used as an illustration, other positions, lines, shapes, and the like are contemplated by the invention. This process is repeated a number of times, using the original values of x and y before the coordinate transformation is performed. In the example, a total of five iterations are preformed at 45-degree increments. FIG. 2 is an illustrative example of a scratch 6 at increments of 45 degrees.

Figure 3:
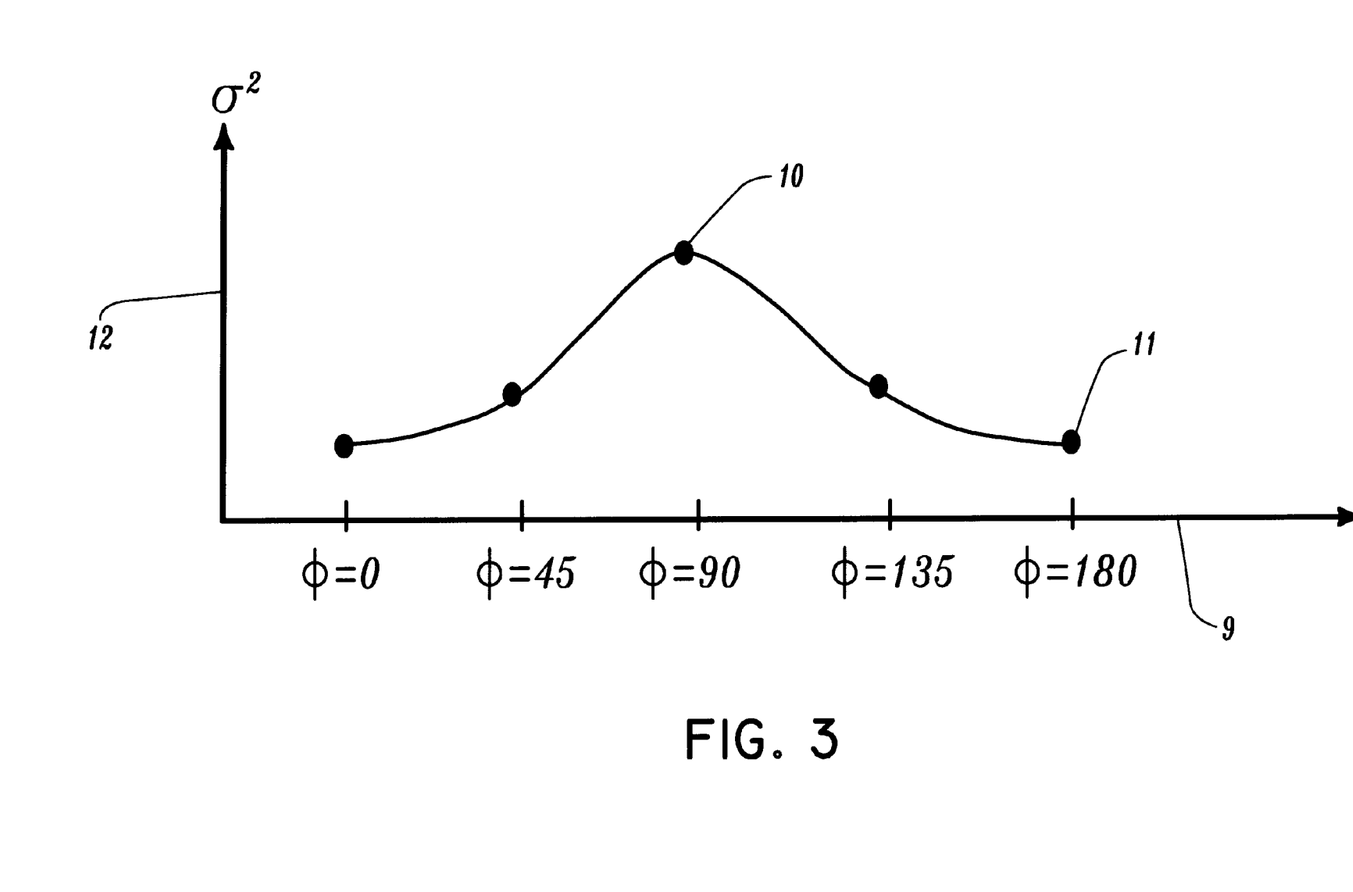
FIG. 3 is a graph of the angle of the rotated black and white image on the horizontal axis, also shown in FIG. 2, against the various standard deviations of the scratch on the vertical axis in accordance with the present invention.

Referring to FIG. 3, the results of such a series of calculations is shown, arranged in graphic form. The standard deviation is shown on vertical axis 12 calculated at five different angles noted on horizontal axis 9. This set of data is an illustration of the method. Note that there is a difference between a highest standard deviation 10 ($\sigma_{max}$) and a lowest standard deviation 11 ($\sigma_{min}$) for the same wafer at different angles relating to the line in the x-direction 8 depicted in FIG. 2.

The present invention will determine the $\sigma_{min}$ 11 and $\sigma_{max}$ 10 from a schedule of standard deviations that correspond to the different angles, as shown in block 310. A ratio 17, $\sigma_{min}/\sigma_{max}$, is calculated in block 320 of FIG. 7 by dividing the $\sigma_{min}$ 11 by $\sigma_{max}$ 10 from the schedule for each wafer. Additional iterations in the previous step will increase the precision of the ratio and final determination. For example, a ratio resulting from ten iterations will be more precise then from five iterations because $\sigma_{min}$ and $\sigma_{max}$ will more accurately reflect the true minimum and maximum standard deviations.

A significant difference between $\sigma_{min}$ 11 and $\sigma_{max}$ 10 may signify that the fail pattern is a scratch-like pattern on the wafer. A straight line will produce the largest variation in the standard deviations because the aspect of the scratch changes dramatically compared to the given line in x-direction 8. The line in x-direction 8 is constant for all iterations. For fails that are randomly distributed or in a circular shape the standard deviation will be nearly constant for each rotation, resulting in a high ratio. For example, if all the cells on the outside edge of the wafer failed, the image of the wafer at different angles would be nearly identical for each iteration, yielding little variation in the standard deviations. Low variation results in a high ratio, e.g. a ratio closer to one. A large difference between $\sigma_{min}$ 11 and $\sigma_{max}$ 10, from a straight scratch for example, will yield a low ratio, closer to zero.

The present invention is not limited to detecting straight scratches, it may also be used with different ratios and given shapes (other than a line in the x-direction 8) to determine the presence of different types of scratches. For example, spots, curves, and circles.

Figure 4:
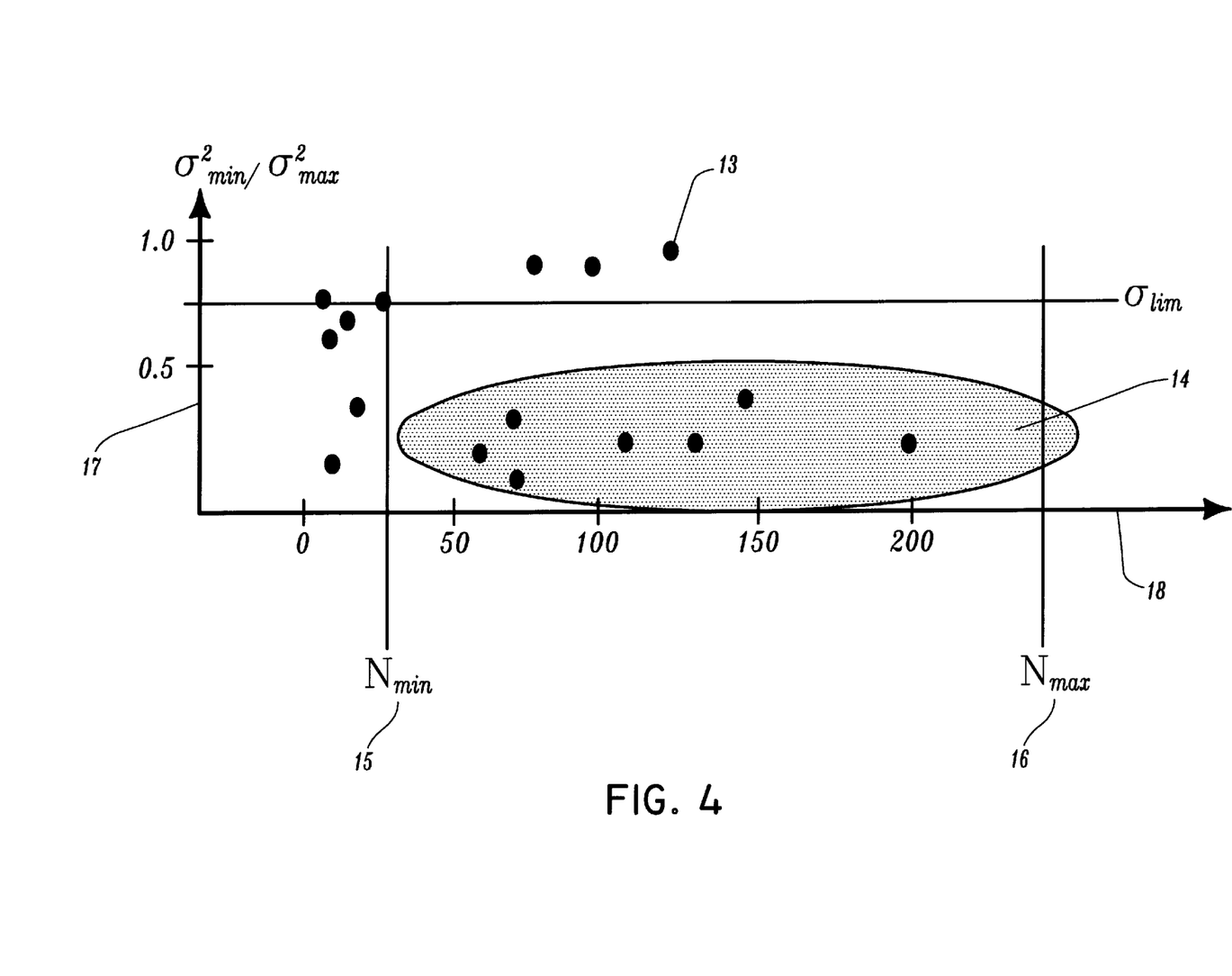
FIG. 4 is a graph of the number of failing cells (N), on the horizontal axis, versus the ratio of lowest and highest standard deviations on the vertical axis, as used to classify scratches in accordance with the present invention.

The number of failed, black cells, N is the second variable necessary to distinguish a scratch from a non-scratch. A limited number of individual fails or a wafer affected nearly entirely, may yield $\sigma_{min}/\sigma_{max}$ ratio 17 that could be recognized as a scratch. A number of failed cells is needed to make that determination. In FIG. 4, each cell 13 corresponds to one wafer. For a straight scratch like pattern, the ratio 17 $\sigma_{min}/\sigma_{max}$ may be low, indicating a scratch, but the number of affected cells 18, N, has to be large enough to include more than just one chip. Alternatively, the number of affected units has to be less than a predetermined maximum 16 to exclude fails affecting nearly the entire wafer. Tests showed that any wafer with $\sigma_{min}/\sigma_{max}$ versus N plotted within the in the gray hatched 14 area in FIG. 4 could be classified, in block 130, as having a scratch or scratches. The scope of this area depends on the number of cells on each wafer.

Figure 8:
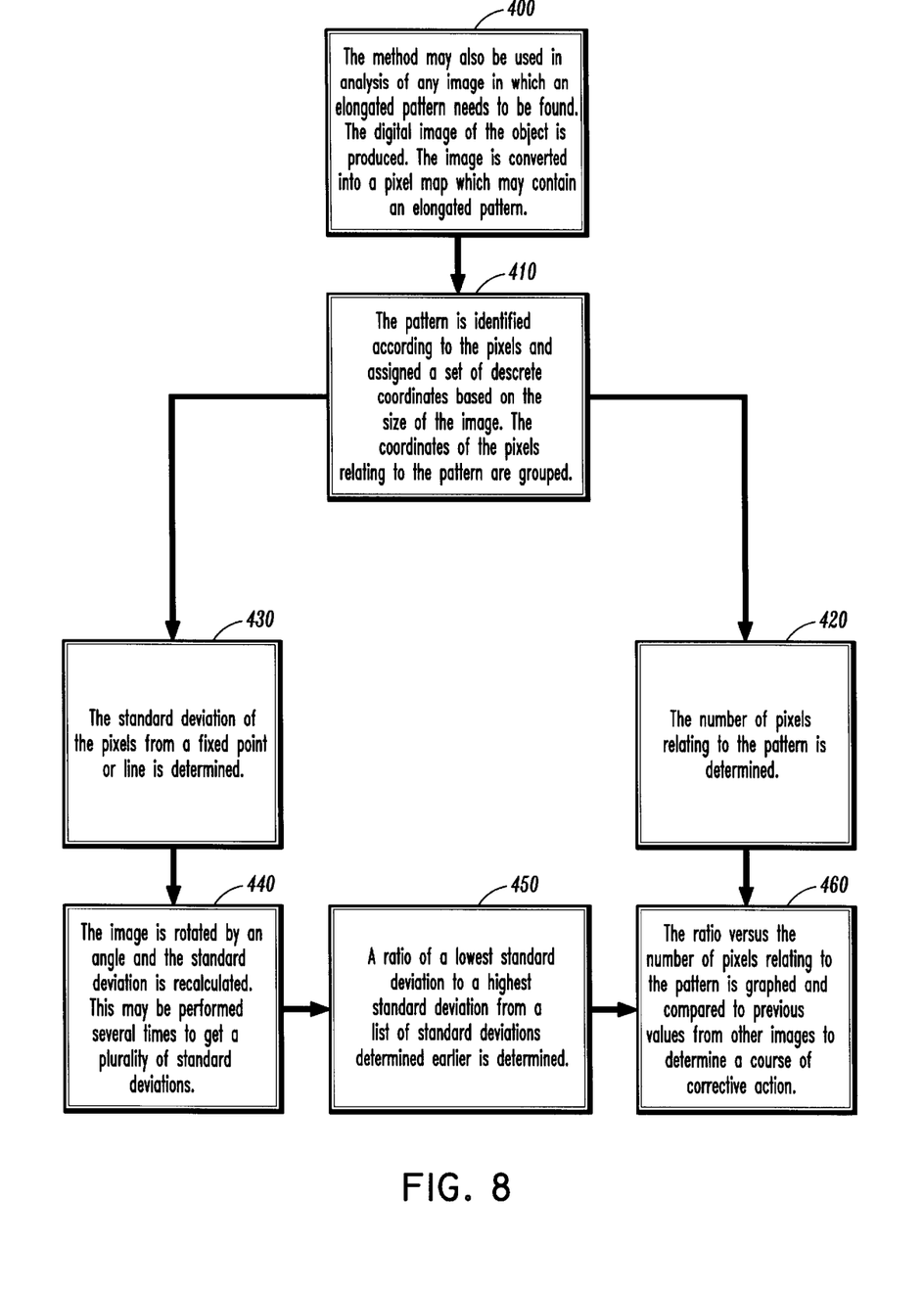
FIG. 8 is a flow chart for making a determination of the presence of an elongated pattern on an image in accordance with the present invention.
Figure 9:
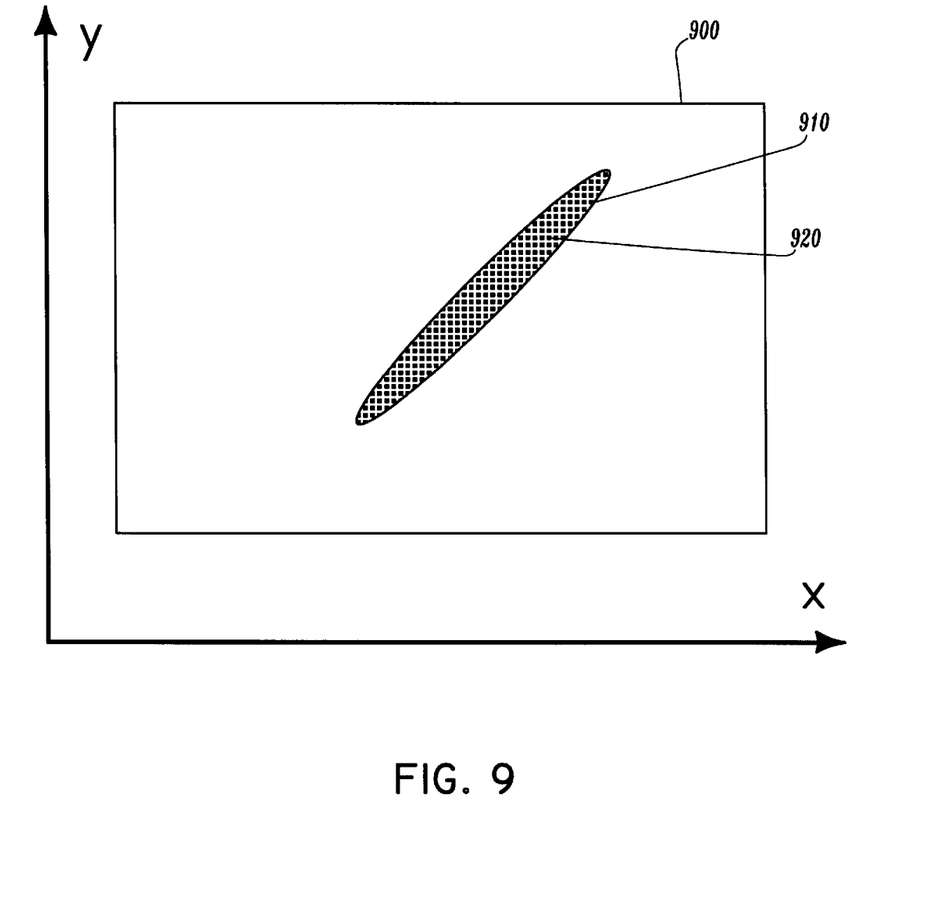
FIG. 9 is an example of an image with an object depicted across the image's length.

An alternative embodiment contemplated by the invention is the classification of an elongated pattern on an image of an object and is presented in FIG. 8. An image is captured and a digital rendering of the image is produced, this digital rendering may be the result of a digital camera, or a download from the Internet. Other sources of images are contemplated by the invention. An example of the image is presented in FIG. 9, an image 900 with an object 910 across the image=s length. The object comprises positions or points 920. Any image may be a suitable subject of the invention such as images of distance planets with surface features such as canyons. Referring now to FIG. 8, the image, block 400, is provided by any suitable means, such as a digital camera or Internet download. In accordance with the method, the image is converted into a pixel map, block 410 based on a coordinate system. If the pattern is present, those pixels which correspond to the object will be identified and grouped, block 410. A total number of pixels relating to the object will be determined in accordance with block 420. A standard deviation is then calculated, block 430, of the pixels from a fixed point or a fixed line according to the formula in the embodiment above. The standard deviation is then recalculated at a different angle, block 440, to the fixed point or line. The standard deviation is calculated at a plurality of angles. A ratio of a lowest standard deviation to a highest standard deviation, from a list of standard deviations, is then determined in block 450. The final determination is made according to block 460, by plotting the ratio versus the number of pixels relating to the object, and comparing a plot to values for previous images.

Having described embodiments of a method for classifying scratches on a semiconductor wafer, and patterns on an image, it is noted that modifications and variation can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set for in the appended claims.

What is claimed is:

1. A method for detecting and classifying a scratch on a semiconductor wafer which comprises the steps of:
   defining a coordinate system for the wafer;
   creating a list of failed cells on the coordinate system corresponding to the cell failures on the wafer;
   defining a total number of failed cells on the wafer;
   determining a standard deviation of the failed cells at a plurality of different angles based on the list of failed cells and the total number of failed cells; and
   comparing a ratio of standard deviations to the number of failed cells to determine the presence of a scratch.

2. The method as recited in claim 1, wherein the step of defining a coordinate system on the wafer, further comprises the steps of:
   assigning chips on the wafer a number of cells in the x and y directions; and
   defining the coordinate system based on the cells and a number of chips.

3. The method as recited in claim 1 wherein the step of creating a list of failed cells, further comprises the steps of:
   assigning failed cells a value;
   creating the list of failed cells based on the cells assigned the value; and
   creating the list of failed cells according to locations on the coordinate system.

4. The method as recited in claim 1, wherein the step of determining a standard deviation of the failed cells at a plurality of different angles, further comprises the steps of:
   calculating the standard deviation for the plurality of different angles from a given position;
   determining the ratio of a lowest standard deviation to a highest standard deviation of the calculated standard deviations;
   graphing the ratio of standard deviations versus the total number of failed cells; and
   comparing a graphed point to points stored in a database to determine if a scratch exists.

5. The method as recited in claim 4, wherein the step of calculating the standard deviation for the plurality of different angles from a given position, further comprising the steps of:

rotating the list of failed cells by a user defined angle;

transforming the list of failed cells through coordinate transformation;

calculating the standard deviation at each angle relative to the given position; and creating a schedule of standard deviations at the different angles.

6. The method as recited in claim 1, wherein the step of determining a standard deviation of the failed cells at a plurality of different angles, further comprising the step of:

calculating the ratio of a lowest standard deviation to a highest standard deviation from a plot of standard deviations; and comparing the ratio of standard deviations and number of failed cells, against a range of values to determine is a scratch exists on the wafer.

7. The method as recited in claim 1, comparing a ratio of standard deviations to the number of failed cells to determine the presence of a scratch, further comprising:

plotting the ratio of a lowest standard deviation to a highest standard deviation versus the number of failed cells;

determining a position in the plot for the ratio and the number of failed cells; and comparing the position to other known positions from prior tests of wafers to determine if a scratch exists.

8. A method for detecting and classifying scratches occurring during semiconductor wafer processing comprising the steps of:

defining a total number of cells of a predefined size in an x and y direction, for chips on a wafer, calculating a total number of cells on the wafer, and developing a normalized coordinate system that assigns values between zero and one for each x and y coordinate;

assigning failed cells a value, creating a schedule of a location of failed cells in the coordinate system;

defining a number of failed cells, having the assigned value from the schedule of failed cells;

calculating a standard deviation at different angles to a given line by rotating the positions of the failed cells by a user defined angle;

transforming a coordinate list through coordinate transformation;

creating a schedule of standard deviations at the different angles;

determining a lowest standard deviation and a highest standard deviation from the schedule;

calculating a ratio of the lowest standard deviation to the highest standard deviation for the wafer from the schedule; and determining the presence of a scratch by comparing the ratio and the number of failed cells against a range of values which are likely to denote a scratch on the wafer.

9. The method as recited in claim 8, wherein the step of developing a normalized coordinate system that assigns values between zero and one for each x and y coordinate, further comprising the step of:

developing a system of cells that assigns values between zero and one for each x and y coordinate by dividing the value in the x or y direction by the total number of cells in the same x or y plane of the cell.

10. The method as recited in claim 8, wherein the step of assigning failed cells a value, creating a schedule of the location of failed cells in the coordinate system, further comprising the step of:

assigning the failed cells the value of 1.

11. The method as recited in claim 8, wherein the step of calculating a standard deviation several times, at different angles to a fixed position by rotating the coordinate list of failed cells by a user defined angle, further comprising the steps of:

rotating through coordinate transformation; and determining the standard deviation at the new angle from the given line.

12. The method as recited in claim 8, wherein the step of creating a schedule of standard deviations at the different angles, further comprising the steps of:

plotting the standard deviation versus the angle of transformation; and identifying the lowest standard deviation and the highest standard deviation from a graph of standard deviation versus the angle of transformation.

13. The method as recited in claim 8, wherein the step of determining the presence of a scratch by comparing the ratio and the number of failed cells against a range of values which are likely to denote a scratch, further comprising the step of:

plotting the ratio versus number of failed cells and comparing the plot to a database of stored points corresponding to scratches on a set of pervious wafers.

* * * * *